US006887765B2

(12) United States Patent
Howard et al.

(10) Patent No.: US 6,887,765 B2
(45) Date of Patent: May 3, 2005

(54) METHOD FOR MANUFACTURING A BIPOLAR JUNCTION TRANSISTOR

(75) Inventors: Gregory E. Howard, Dallas, TX (US); Angelo Pinto, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 236 days.

(21) Appl. No.: 10/007,954

(22) Filed: Dec. 7, 2001

(65) Prior Publication Data

US 2002/0076893 A1 Jun. 20, 2002

Related U.S. Application Data

(60) Provisional application No. 60/256,775, filed on Dec. 19, 2000.

(51) Int. Cl.[7] ............................................. H01L 21/331
(52) U.S. Cl. ..................... 438/350; 438/365; 438/366; 438/374; 257/E29.03; 257/E29.184
(58) Field of Search ................................ 438/350, 365, 438/366, 374, 347, 344, 343, 378, 368, 370; 257/E29.03, E29.183

(56) References Cited

U.S. PATENT DOCUMENTS

| | | | | | |
|---|---|---|---|---|---|
| 4,769,337 A | * | 9/1988 | Maeda | ...................... | 438/208 |
| 4,977,098 A | * | 12/1990 | Yu et al. | .................... | 438/208 |
| 5,234,846 A | * | 8/1993 | Chu et al. | ................... | 438/311 |
| 5,326,722 A | * | 7/1994 | Huang | ......................... | 438/365 |
| 5,387,545 A | * | 2/1995 | Kiyota et al. | .............. | 438/299 |
| 5,708,281 A | * | 1/1998 | Morishita | ................... | 438/565 |
| 5,885,880 A | * | 3/1999 | Gomi | ......................... | 438/322 |
| 6,180,478 B1 | * | 1/2001 | Lee et al. | ................... | 438/309 |

FOREIGN PATENT DOCUMENTS

EP      0466195 A2 * 1/1992

OTHER PUBLICATIONS

Wolf et al., "Silicon Processing For The VLSI Era", vol. 1: Process Technology; Lattice Press;1986; pp 303–308.*
Warnock, James D., "Silicon Bipolar Device Structures for Digital App;ications: Technology Trends and Future Directions," *IEEE Transactions on Electron Devices*, vol. 42. No. 3, Mar. 1995. pp. 377–389.
Burghartz, Joachim N., et al., "Identification of Perimeter Depletion and Emitter Plug Effects in Deep–Submicrometer, Shallow–Junction Polysilicon Emitter Bipolar Transistors," *IEEE Transactions on Electron Devices*, vol. 39, No. 6. Jun. 1992. pp. 1477–1489.
Onai, Takahiro, et al., "Self–Aligned Complementary Bipolar Technology for Low–Power Dissipation and Ultra–High–Speed LSI's," *IEEE Transactions on Electron Devices*. vol. 42, No. 3, Mar. 1995. pp. 413–418.
Van Wijnen, Paul J., et al., "A New Approach to Optimizing the Base Profile for High–Speed Bipolar Transistors," *IEEE Electron Device Letters*, vol. No. 4, Apr. 1990. pp. 149–152.
Fahey, P. M., et al., "Point Defects and Dopant Diffusion in Silicon," *Reviews of Modern Physics*, vol. 61. No. 2, Apr. 1989. pp. 289–384.

* cited by examiner

*Primary Examiner*—Trung Dang
(74) *Attorney, Agent, or Firm*—Peter K. McLarty; W. James Brady, III; Frederick J. Telecky, Jr.

(57) ABSTRACT

According to one embodiment of the invention, a method used in manufacturing an intermediate structure in a bipolar junction transistor includes implanting a base dopant in a semiconductor substrate to form a base, forming a dielectric layer outwardly from the semiconductor substrate, etching a portion of the dielectric layer to form an emitter region, forming an emitter polysilicon layer on the semiconductor substrate, and after forming the emitter polysilicon layer, annealing the semiconductor substrate.

13 Claims, 4 Drawing Sheets

METHOD FOR MANUFACTURING A BIPOLAR JUNCTION TRANSISTOR

CROSS-REFERENCE TO RELATED APPLICATIONS

This application claims priority under 35 USC § 119(e)(1) of provisional application Ser. No. 60/256,775, filed Dec. 19, 2000.

This application is related to a provisional patent application filed on the same date as the instant provisional application, entitled Method For Manufacturing A Bipolar Junction Transistor.

TECHNICAL FIELD OF THE INVENTION

This invention relates generally to the field of semiconductor devices and, more specifically, to a method for manufacturing a bipolar junction transistor.

BACKGROUND OF THE INVENTION

Semiconductor devices are used for many applications, and one component used extensively in semiconductor devices is a transistor. There are many different types of transistors, including bipolar junction transistors. Bipolar junction transistors ("BJTs") are used to make other types of transistors and devices, such as a complementary metal oxide semiconductor ("CMOS"), which utilizes NPN and PNP BJTs for increased performance.

Many processes are used in manufacturing BJTs. One such process is annealing. One function of annealing is to control the formation and diffusion of various dopants. A problem with annealing is that too much, or too little, diffusion of dopants occurs depending on the time and temperature of the annealing process. Depending on the type of BJT being manufactured, an annealing process can cause undesirable base concentrations and base widths as well as undesirable emitter widths. Accordingly, these undesirable attributes can hurt BJT performance, including reduced speed, band-to-band tunneling, and less than optimal linearity. Therefore, semiconductor manufacturers desire methods of manufacturing BJTs that control the formation and diffusion of dopants so that the performance of BJTs is improved.

SUMMARY OF THE INVENTION

The challenges in the field of semiconductor devices continue to increase with demands for more and better techniques having greater flexibility and adaptability. Therefore, a need has arisen for a new method for manufacturing a bipolar junction transistor.

In accordance with the present invention, a method for manufacturing a bipolar junction transistor is provided that addresses disadvantages and problems associated with previously developed methods.

According to one embodiment of the invention, a method used in manufacturing an intermediate structure in a bipolar junction transistor includes implanting a base dopant in a semiconductor substrate to form a base, forming a dielectric layer outwardly from the semiconductor substrate, etching a portion of the dielectric layer to form an emitter region, forming an emitter polysilicon layer on the semiconductor substrate, and after forming the emitter polysilicon layer, annealing the semiconductor substrate.

Embodiments of the invention provide numerous technical advantages. For example, a technical advantage of one embodiment of the present invention is the reduction of the base peak concentration at the polysilicon-to-silicon interface, thereby increasing performance of bipolar junction transistors. Another technical advantage of one embodiment of the present invention is that optimizing the base doping density profile substantially reduces or eliminates the emitter-base band-to-band tunneling problem in bipolar technology. An additional technical advantage of the present invention is that the polysilicon-to-silicon oxide breakup is separated from the emitter diffusion, thereby allowing a significant thermal budget reduction at the emitter diffusion. A further technical advantage of the present invention is that a shallow emitter profile is obtained, which increases the speed of a bipolar junction transistor.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Example embodiments of the present invention and their advantages are best understood by referring now to FIGS. 1 through 3D of the drawings, in which like numerals refer to like parts.

Figure 1:
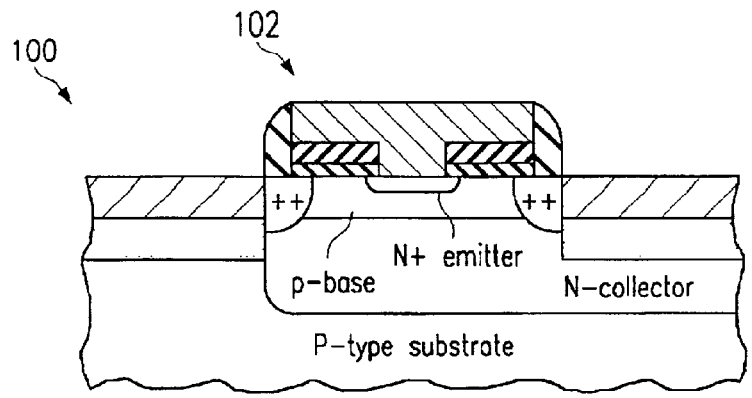
FIG. 1 is a cross-sectional view of a partially completed semiconductor device showing a substantially completed bipolar junction transistor manufactured according to the teachings of the present invention.

FIG. 1 is a cross-sectional view of a partially completed semiconductor device 100 showing a substantially completed bipolar junction transistor ("BJT") 102 manufactured according to the teachings of the present invention. BJT 102 is shown in FIG. 1 to be a vertical NPN bipolar junction transistor; however, BJT 102 may be formed in other configurations, such as a PNP configuration. Many processes are used in manufacturing bipolar junction transistors; one such process is annealing. An annealing process is a heat treating process that controls, among other things, the formation and diffusion of various dopants in semiconductors. One problem with annealing is that too much, or too little, diffusion of dopants occurs depending on the time and temperature of the annealing process. Depending on the type of bipolar junction transistor being manufactured, an annealing process can cause undesirable base concentrations and base widths as well as undesirable emitter widths. These undesirable attributes can hurt bipolar junction transistor performance, including reduced speed, band-to-band tunneling, and less than optimal linearity. The present invention addresses these problems, and others, by providing a method of manufacturing BJT 102 that includes an additional annealing step. One embodiment of such a method is illustrated in FIGS. 2A through 2G.

FIGS. 2A through 2G are a series of cross-sectional views illustrating various manufacturing stages of BJT 102 in accordance with the teachings of the present invention.

Figure 2A:
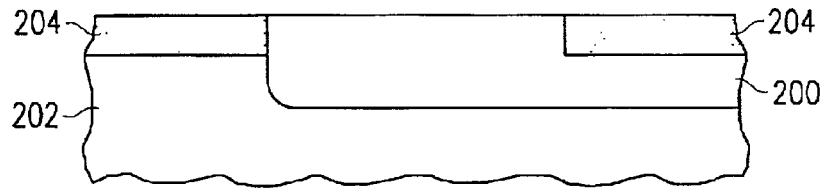
FIGS. 2A through 2G are a series of cross-sectional views illustrating various manufacturing stages of the bipolar junction transistor of FIG. 1.

FIG. 2A shows a collector 200 formed in a semiconductor substrate 202 and disposed between isolation regions 204. Collector 200 is an N-type collector if BJT 102 is an NPN bipolar junction transistor or a P-type collector if BJT 102 is a PNP bipolar junction transistor. In the embodiment shown in FIG. 2A, collector 200 is an N-type collector; therefore, collector 200 includes one or more doped regions formed from, for example, a gas such as arsenic, phosphorus, or antimony. These doped regions may take the form of, for example, an N-well along with a buried $N^+$ region.

Semiconductor substrate 202 is either a P-type substrate or an N-type substrate depending on the type of BJT 102. In an NPN bipolar junction transistor, semiconductor substrate 202 is a P-type substrate, and in a PNP bipolar junction transistor semiconductor substrate 202 is an N-type substrate. Semiconductor substrate 202 may be formed from any suitable type of semiconductor material, such as silicon.

Isolation regions 204 are, in one embodiment, oxide regions formed using a shallow trench isolation ("STI") process well known in the art of semiconductor processing; however, isolation regions 204 may be formed using other methods and may be formed from any suitable type of dielectric material, such as other oxides or nitrides. Isolations regions 204 serve to isolate adjacent bipolar junction transistors formed in semiconductor device 100.

Figure 2B:
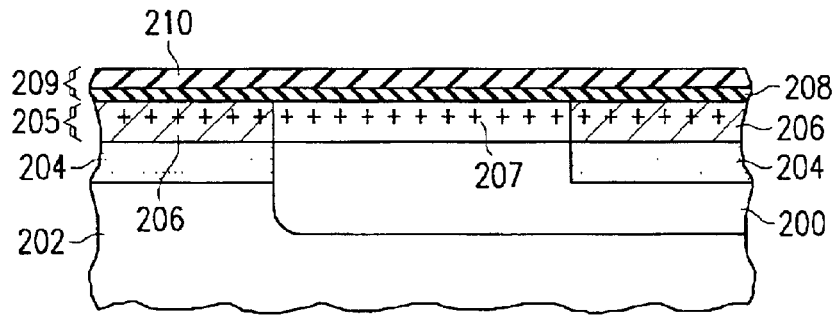

FIG. 2B shows an epitaxial silicon layer 205 formed outwardly from semiconductor substrate 202, and a dielectric layer 209 formed outwardly from epitaxial silicon layer 205. As illustrated in FIG. 2B, epitaxial silicon layer 205 forms epitaxial polysilicon regions 206 outwardly from isolation regions 204 and forms additional epitaxial silicon between these regions. Epitaxial silicon layer 205 is silicon used for implanting base dopants. After forming epitaxial silicon layer 205, a first base dopant 207 is implanted using any suitable implantation process. In one embodiment, this includes forming a thin oxide layer on semiconductor substrate 202, implanting first base dopant 207, and thereafter stripping the oxide. In the embodiment shown in FIG. 2B, first base dopant 207 (denoted by the "+'s") is formed from a gas, such as boron; however, first base dopant 207 may be an N-type dopant formed from, for example, a gas such as arsenic, phosphorus, or antimony. An annealing process may be performed after the stripping of the oxide to improve the deleterious effects of the implant and to reduce transient enhanced diffusion ("TED"). This annealing process is well known in the art of semiconductor processing as a "damage" anneal. A typical damage anneal is performed at a temperature between approximately 1000° C. and 1050° C. for a time period of approximately five to ten seconds.

In one embodiment, dielectric layer 209 is formed from a first oxide layer 208 and a first nitride layer 210 formed outwardly from first oxide layer 208; however, dielectric layer 209 may be formed from any suitable type of dielectric material. In addition, dielectric layer 209 may be any desired thickness. In the embodiment shown in FIG. 2B, first oxide layer 208 is formed from any suitable type of oxide and is formed using any suitable growth or deposition techniques conventionally used in semiconductor processing. Similarly, first nitride layer 210 is formed from any suitable type of nitride, and is formed using any suitable growth or deposition techniques conventionally used in semiconductor processing. Both first oxide layer 208 and first nitride layer 210 may be any desired thickness. In one embodiment, first oxide layer 208 is approximately 100 Å and first nitride layer 210 is approximately 700 Å.

Figure 2C:
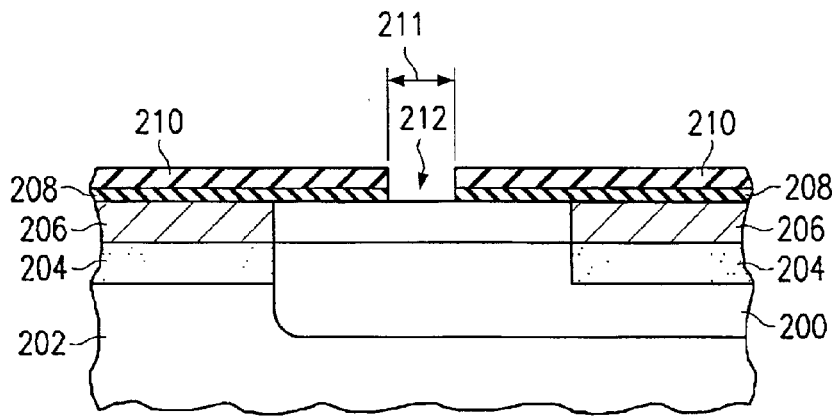

FIG. 2C shows an emitter region 212 formed by removing a portion of first oxide layer 208 and first nitride layer 210. This removal is accomplished by, for example, anistropically dry etching a portion of first nitride layer 210 and wet etching a portion of first oxide layer 208. Emitter region 212 is the basis for a contact for an emitter 230 (FIG. 2G) of BJT 102. In one embodiment, a width 211 of emitter region 212 is greater than the combined thickness of first oxide layer 208 and first nitride layer 210 to ensure no voids are created when an emitter polysilicon layer 214 (FIG. 2D) is formed.

Figure 2D:
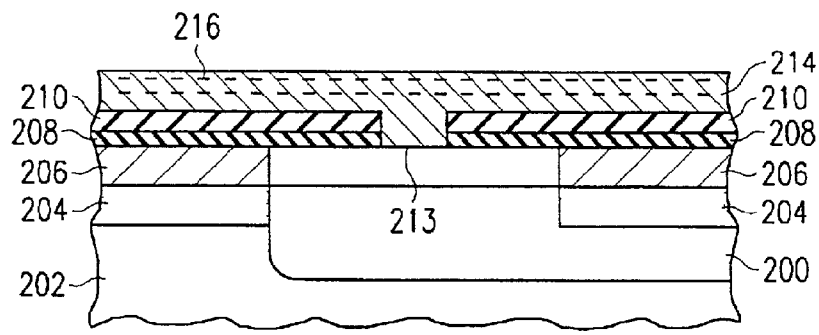

To avoid over-etching (i.e., etching into silicon below first oxide layer 208) while forming emitter region 212, the wet etch process typically results in a thin oxide layer (approximately 10–20 Å) at the surface of the silicon below first oxide layer 208. To increase the performance of BJT 102 this thin oxide layer needs to be substantially reduced or eliminated to create a good polysilicon to silicon interface 213 (FIG. 2D). As discussed more fully below in conjunction with FIG. 2D, this "oxide break-up" is accomplished by an annealing process according to the teachings of the present invention.

FIG. 2D shows emitter polysilicon layer 214 formed outwardly from first nitride layer 210 and within emitter region 212, and an emitter dopant 216 implanted in emitter polysilicon layer 214. Emitter polysilicon layer 214 is used to form emitter 230 (FIG. 2G) of BJT 102 and for a contact for emitter 230. Emitter dopant 216 (denoted by the "−'s" in FIG. 2D) is the basis for the formation of emitter 230 (FIG. 2G) of BJT 102, and is implanted using any suitable implantation process.

According to the teachings of the invention, after emitter polysilicon layer 214 is formed, but before emitter implant 216 is implanted, an annealing process is performed on semiconductor device 100. This annealing process is performed for various reasons. One reason is to diffuse first base dopant 207 (which was implanted after forming epitaxial silicon layer 205 as discussed above in conjunction with FIG. 2B) away from interface 213 to avoid first base dopant 207 peaking at interface 213. This diffusion results in a more square/box-like base doping profile, which results in a number of technical advantages as discussed more fully below in conjunction with FIGS. 3A–3D. Another reason for this anneal process is to break-up the thin oxide layer at interface 213 created when emitter region 212 was formed (as discussed above in conjunction with FIG. 2C). In one embodiment, this annealing process is performed at a temperature between approximately 1000° C. and 1100° C. for a time period of approximately ten and forty-five seconds. In a more particular embodiment, this annealing process is performed at a temperature of approximately 1050° C. for a time period of approximately thirty seconds.

Figure 2E:
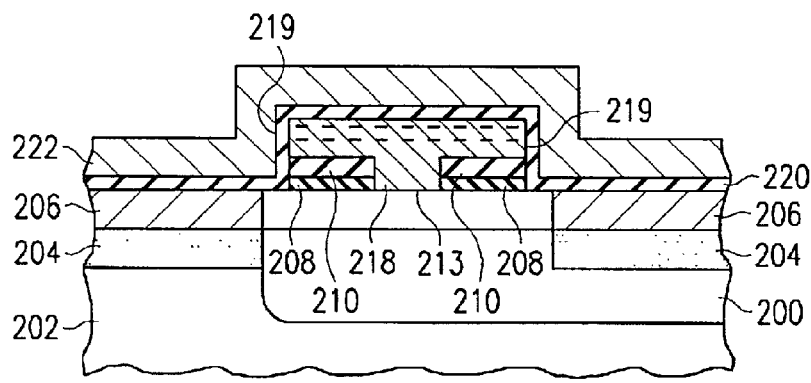

FIG. 2E shows an emitter polysilicon region 218 having sidewalls 219 formed by etching emitter polysilicon layer 214, a second oxide layer 220 formed outwardly from epitaxial silicon regions 206, emitter polysilicon region 218, and sidewalls 219, and a second nitride layer 222 formed outwardly from second oxide layer 220. Emitter polysilicon region 218 is used as a contact for emitter 230 (FIG. 2G) of BJT 102 and as the basis for the formation of emitter 230 of BJT 102.

Second oxide layer 220 is formed from any suitable type of oxide and is formed using any suitable growth or deposition techniques conventionally used in semiconductor processing. Similarly, second nitride layer 222 is formed from any suitable type of nitride, and is formed using any suitable growth or deposition techniques conventionally used in semiconductor processing. Both second oxide layer 220 and second nitride layer 222 may be any desired thickness. In one embodiment, second oxide layer 220 is approximately 100 Å and second nitride layer 222 is approximately 2000 Å. Both second oxide layer 220 and second nitride layer 222 are used in forming nitride regions 224 (FIG. 2F).

Figure 2F:
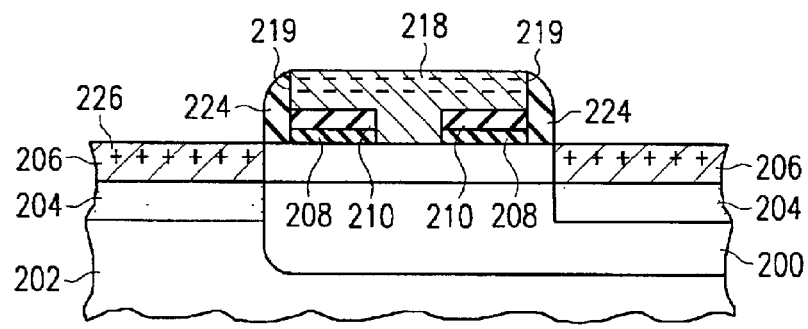

FIG. 2F shows nitride regions 224 formed on sidewalls 219. Nitride regions 224 are formed by an etchback process well known in the art of semiconductor processing, which typically includes dry etching second nitride layer 222 until nitride regions 224 are formed. FIG. 2F further shows a second base dopant 226 implanted in epitaxial polysilicon regions 206 using any suitable implantation process. Second base dopant 226 is used in forming P⁺ regions 228 described below in conjunction with FIG. 2G.

Figure 2G:
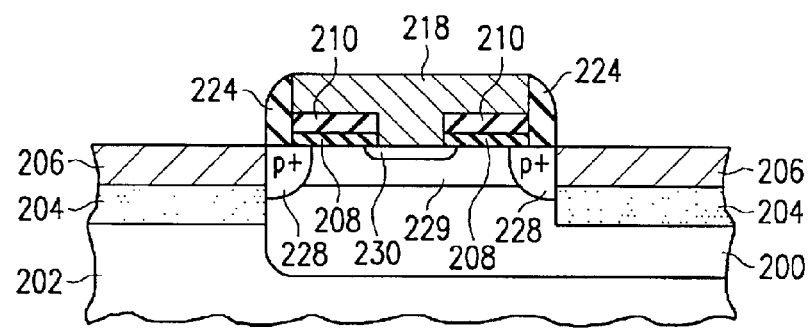

FIG. 2G shows P⁺ regions 228 formed in a base 229 and emitter 230 formed in base 229, which substantially completes BJT 102. P⁺ regions 228 are highly-doped regions that allow for a better contact of base 229 with epitaxial polysilicon regions 206. P⁺ regions 228 and emitter 230 are formed as a result of an anneal process according to the teachings of the present invention. Typically, this anneal process is performed at a temperature in the range between approximately 900° C. and 1000° C. for a time period between approximately 10 and 30 seconds depending on the type of dopants used for base 229 and emitter 230. This anneal process results in emitter 230 having a narrower width (i.e., shallower) than that of typical bipolar junction transistors, as well as resulting in a sharper emitter 230\base 229 junction. A shallower emitter 230 and a sharper emitter 230/base 229 junction results in a number of technical advantages as discussed more fully below in conjunction with FIGS. 3A–3D.

According to the teachings of the present invention, BJT 102 results in a more efficient, and better performing, bipolar junction transistor. BJT 102 has increased speed, improved linearity, and reduces or substantially eliminates band-to-band tunneling effects typically found in bipolar technology. The present invention accomplishes this by forming a narrow-width base 229 with a square/box like doping profile (FIGS. 3C and 3D), a shallow emitter 230, and a sharper emitter 230/base 229 junction. These attributes of BJT 102 are described more fully below in conjunction with FIGS. 3A through 3D.

Figure 3A:
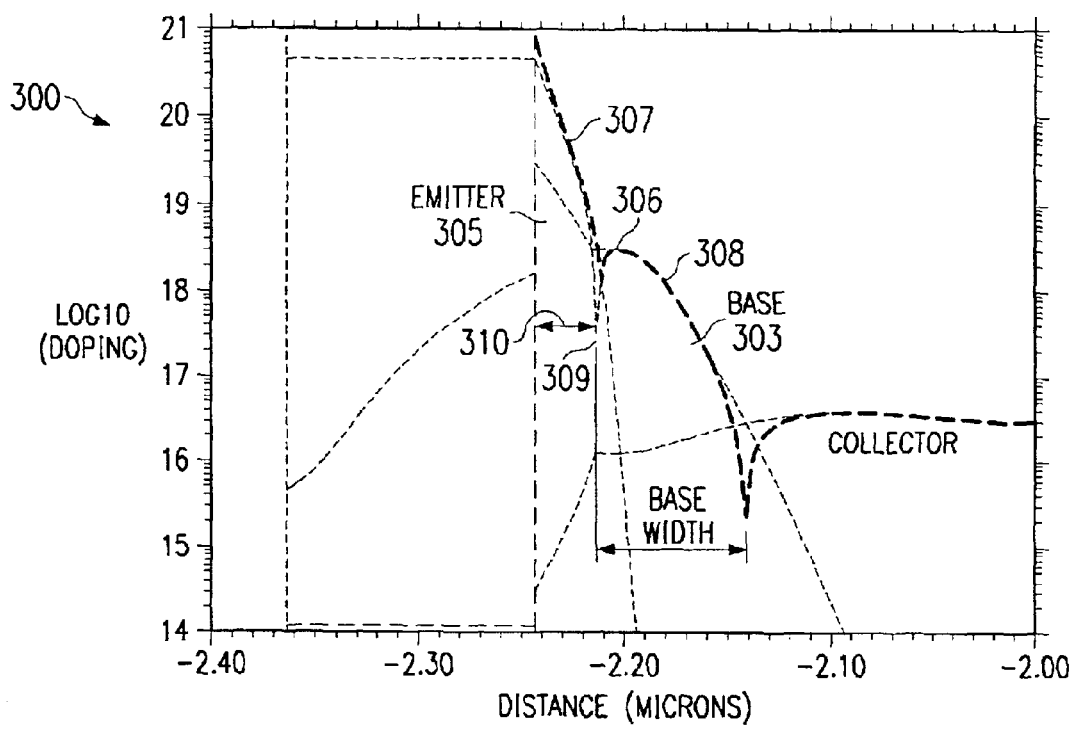
FIGS. 3A and 3B are doping density graphs illustrating doping density profiles of typical NPN and PNP bipolar junction transistors.
Figure 3B:
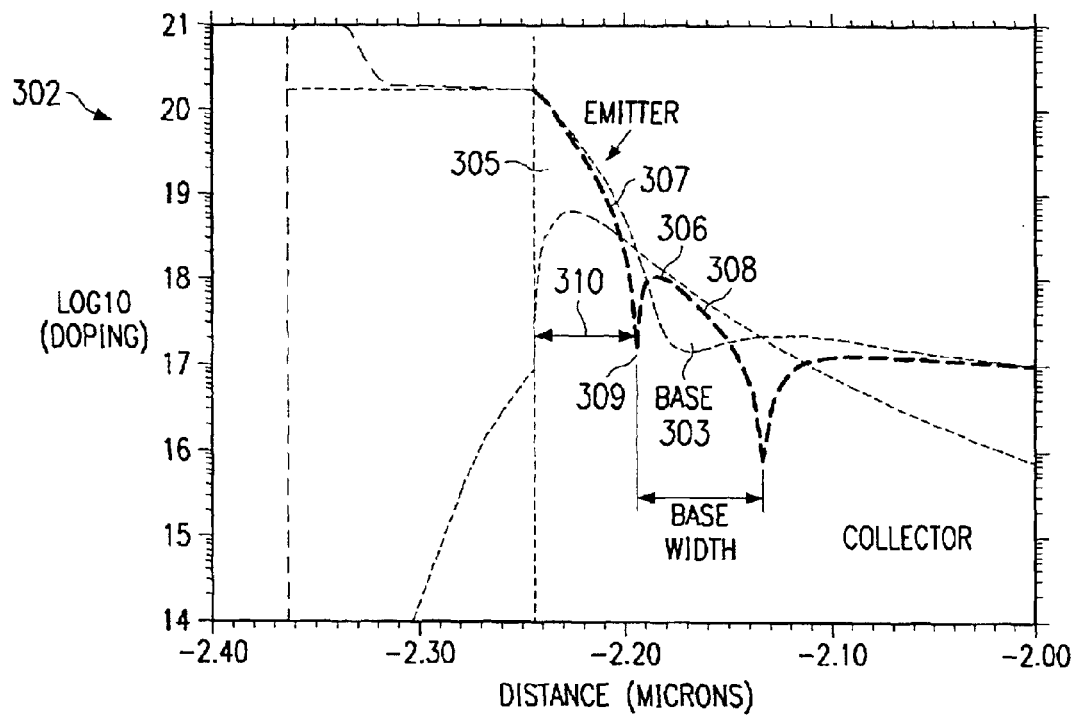

FIGS. 3A and 3B are doping density graphs (sometimes referred to as concentration versus depth graphs) illustrating a doping density graph 300 for an NPN bipolar junction transistor and a doping density graph 302 for a PNP bipolar junction transistor. The doping density profiles plot the doping concentration of various dopants along the y-axis and distance into semiconductor substrate 202 along the x-axis. As illustrated in FIGS. 3A and 3B, one problem with existing bipolar junction transistors is the tendency of a base dopant 303 to segregate towards a silicon surface 304 as an emitter dopant 305 diffuses. This segregation causes a base peak concentration 306 shown in graphs 300, 302. When emitter dopant 305 is diffused an emitter doping profile 307 intersects a base doping profile 308 along a downward slope of base doping profile 308 as shown by point 309 in graphs 300, 302. This is not a desired characteristic for a high performance bipolar junction transistor. Ideally, emitter doping profile 307 should intersect base doping profile 308 at, or near, base peak concentration 306 for optimum processing reproducibility and linearity.

Also shown in FIGS. 3A and 3B are emitters having an emitter width 310. Emitter width 310 indicates how deep emitter dopant 305 diffuses into the silicon. As is well known in the art of bipolar technology, the greater the emitter width the slower the bipolar junction transistor operates. The present invention addresses these problems, and others, as described below in conjunction with FIGS. 3C and 3D.

Figure 3C:
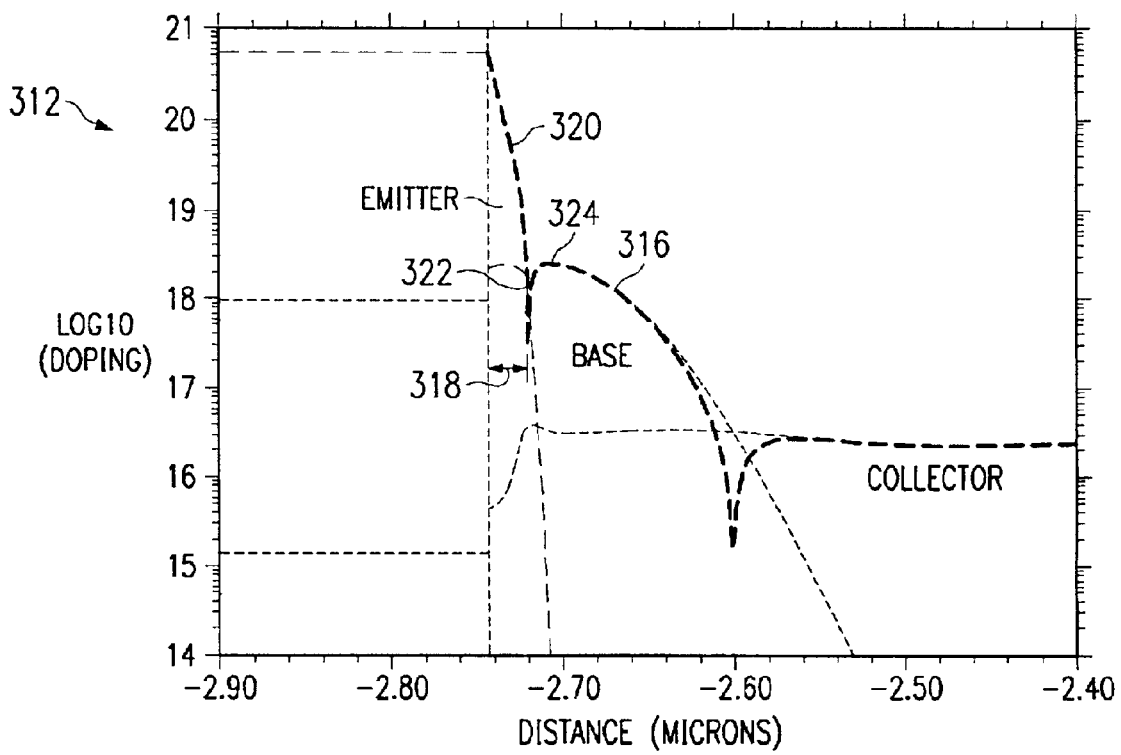
FIGS. 3C and 3D are doping density graphs illustrating doping density profiles of NPN and PNP bipolar junction transistors manufactured according to one embodiment of the teachings of the present invention.
Figure 3D:
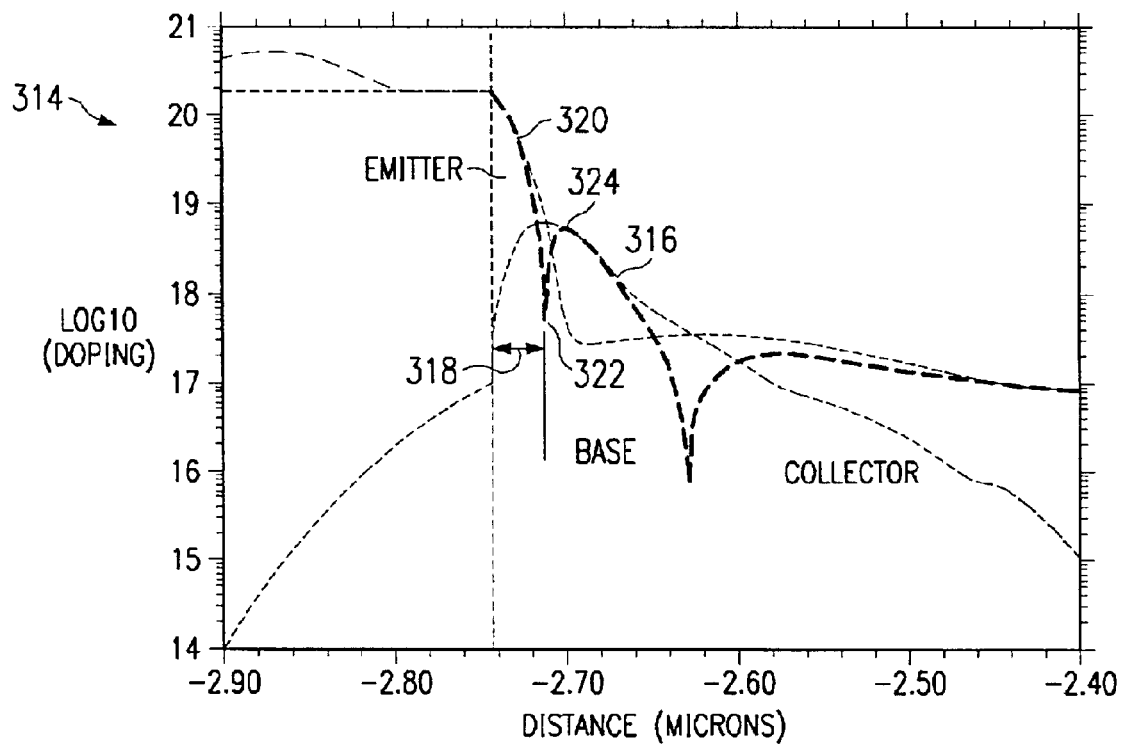

FIGS. 3C and 3D are doping density graphs illustrating a doping density profile 312 of an NPN BJT 102 and a doping density profile 314 of a PNP BJT 102 manufactured according to the teachings of the present invention. As shown in graphs 312, 314, a base doping profile 316 of BJT 102 has a more square/box like profile as opposed to the more pronounced base peak concentration 306 as shown in FIGS. 3A and 3B. In addition, an emitter width 318 is shown in FIGS. 3C and 3D to have a narrower width (i.e., shallower) than emitter width 310 as shown in FIGS. 3A and 3B. Furthermore, an emitter doping profile 320 intersects base doping profile 316 closer to a base peak concentration 324 than in standard bipolar junction transistors, as indicated by point 322 in graphs 312, 314. These desirable attributes of BJT 102 result from performing an additional annealing step after depositing or forming emitter polysilicon layer 214 as described above in conjunction with FIG. 2D. This annealing process allows a subsequent annealing process for forming emitter 230 (discussed above in conjunction with FIG. 2G) to be reduced in time and temperature. This reduced thermal budget results in a shallower emitter 230 and a sharper emitter 230/base 229 junction, which improves the overall performance of BJT 102.

Although embodiments of the invention and their advantages are described in detail, a person skilled in the art could make various alternations, additions, and omissions without departing from the spirit and scope of the present invention as defined by the appended claims.

What is claimed is:

1. A method of manufacturing a bipolar junction transistor, comprising:
  implanting a first base dopant in a semiconductor substrate;
  after implanting the first base dopant, annealing the semiconductor substrate;
  forming a first oxide layer outwardly from the semiconductor substrate;
  forming a first nitride layer outwardly from the first oxide layer;
  etching a first portion of the first nitride layer and the first oxide layer to form an emitter region;
  forming an emitter polysilicon layer on the semiconductor substrate;
  after forming the emitter polysilicon layer, annealing the semiconductor substrate;
  implanting an emitter dopant in the emitter polysilicon layer;
  etching a portion of the emitter polysilicon layer, a second portion of the first nitride layer and the first oxide layer to form an emitter polysilicon region having sidewalls;
  forming nitride regions on the sidewalls;
  implanting a second base dopant in the semiconductor substrate; and
  after implanting the second base dopant, annealing the semiconductor substrate to form an emitter and highly-doped base regions.

2. The method of claim 1, wherein implanting a first base dopant in a semiconductor substrate comprises forming the semiconductor substrate with a collector disposed between isolation regions.

3. The method of claim 1, wherein etching a first portion of the first nitride layer and the first oxide layer to form an emitter region comprises forming the emitter region with a width greater than a combined thickness of the first oxide layer and the first nitride layer.

4. The method of claim 1, wherein annealing the semiconductor substrate after implanting the first base dopant comprises annealing the semiconductor substrate at a temperature between approximately 1000° C. and 1050° C. for a time period between approximately five and ten seconds.

5. The method of claim 1, wherein annealing the semiconductor substrate after forming the emitter polysilicon layer comprises annealing the semiconductor substrate at a temperature between approximately 1000° C. and 1100° C. for a time period between approximately 10 and 45 seconds.

6. The method of claim 1, wherein annealing the semiconductor substrate after forming the emitter polysilicon layer comprises annealing the semiconductor substrate at a temperature of approximately 1050° C. for a time period of approximately 30 seconds.

7. The method of claim 1, wherein annealing the semiconductor substrate after implanting the second base dopant comprises annealing the semiconductor substrate at a temperature between approximately 900° C. and 1000° C. for a time period between approximately 10 and 30 seconds.

8. A method of manufacturing a bipolar junction transistor structure, comprising:

forming isolation regions in a semiconductor substrate;

forming an epitaxial silicon layer outwardly from the semiconductor substrate;

implanting a first base dopant in the semiconductor substrate;

after implanting the first base dopant, annealing the semiconductor substrate;

forming a first oxide layer outwardly from the epitaxial silicon layer;

forming a first nitride layer outwardly from the first oxide layer;

etching a first portion of the first nitride layer and the first oxide layer to form an emitter region;

forming an emitter polysilicon layer on the semiconductor substrate;

after forming the emitter polysilicon layer, annealing the semiconductor substrate;

implanting an emitter dopant in the emitter polysilicon layer;

etching a portion of the emitter polysilicon layer, a second portion of the first nitride layer and the first oxide layer to form an emitter polysilicon region having sidewalls;

forming a second oxide layer outwardly from the epitaxial silicon layer, the emitter polysilicon region and the sidewalls;

forming a second nitride layer outwardly from the second oxide layer;

anisotropically etching the second nitride layer, thereby forming nitride regions on the sidewalls;

implanting a second base dopant in the epitaxial silicon layer; and after implanting the second base dopant, annealing the semiconductor substrate to form an emitter and highly-doped base regions.

9. The method of claim 8, wherein etching a first portion of the first nitride layer and the first oxide layer to form an emitter region comprises forming the emitter region with a width greater than a combined thickness of the first oxide layer and the first nitride layer.

10. The method of claim 8, wherein annealing the semiconductor substrate after implanting the first base dopant comprises annealing the semiconductor substrate at a temperature between approximately 1000° C. and 1050° C. for a time period between approximately five and ten seconds.

11. The method of claim 8, wherein annealing the semiconductor substrate after forming the emitter polysilicon layer comprises annealing the semiconductor substrate at a temperature between approximately 1000° C. and 1100° C. for a time period between approximately 10 and 45 seconds.

12. The method of claim 8, wherein annealing the semiconductor substrate after forming the emitter polysilicon layer comprises annealing the semiconductor substrate at a temperature of approximately 1050° C. for a time period of approximately 30 seconds.

13. The method of claim 8, wherein annealing the semiconductor substrate after implanting the second base dopant comprises annealing the semiconductor substrate at a temperature between approximately 900° C. and 1000° C. for a time period between approximately 10 and 30 seconds.

* * * * *